United States Patent
Sekine et al.

(10) Patent No.: US 8,187,973 B2
(45) Date of Patent: May 29, 2012

(54) METHOD FOR MANUFACTURING SEMICONDUCTOR DEVICE AND THE SEMICONDUCTOR DEVICE

(75) Inventors: Katsuyuki Sekine, Yokohama (JP); Kazuhei Yoshinaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 433 days.

(21) Appl. No.: 12/404,832

(22) Filed: Mar. 16, 2009

(65) Prior Publication Data

US 2009/0256188 A1    Oct. 15, 2009

(30) Foreign Application Priority Data

Apr. 10, 2008  (JP) .................... 2008-102318

(51) Int. Cl.
*H01L 21/44*   (2006.01)

(52) U.S. Cl. ........ 438/680; 438/287; 438/758; 438/785; 438/786; 438/794; 438/778; 257/632; 257/634; 257/637; 257/639; 257/642; 257/659; 257/E21.267; 257/E21.271; 257/E21.274; 257/E21.278; 257/E21.312

(58) Field of Classification Search .................. 257/632, 257/634–637, 639–642, 646, 649, 659, E21.267–E21.269, 257/E21.271, E21.274, E21.278, E21.312; 438/287, 680, 758, 785, 778, 786–794

See application file for complete search history.

(56) References Cited

U.S. PATENT DOCUMENTS

| 6,391,803 | B1 | 5/2002 | Kim et al. | |
|---|---|---|---|---|
| 2001/0041250 | A1* | 11/2001 | Werkhoven et al. | 428/212 |
| 2003/0188682 | A1 | 10/2003 | Tois et al. | |
| 2003/0235961 | A1* | 12/2003 | Metzner et al. | 438/287 |
| 2007/0128865 | A1* | 6/2007 | Sato et al. | 438/680 |

FOREIGN PATENT DOCUMENTS

WO   WO 01/40541 A1   6/2001

* cited by examiner

*Primary Examiner* — Meiya Li
(74) *Attorney, Agent, or Firm* — Finnegan, Henderson, Farabow, Garrett & Dunner, L.L.P.

(57) ABSTRACT

A method for manufacturing a semiconductor device which includes: alternately supplying a silicon source and an oxidant to deposit a silicon oxide film on a surface of a semiconductor substrate, wherein the silicon source is supplied under a supply condition where an adsorption amount of molecules of the silicon source on the semiconductor substrate is increased without causing an adsorption saturation of the molecules of the silicon source on the semiconductor substrate, and wherein the oxidant is supplied under a supply condition where impurities remain in the molecules of the silicon source adsorbed on the semiconductor substrate.

13 Claims, 13 Drawing Sheets

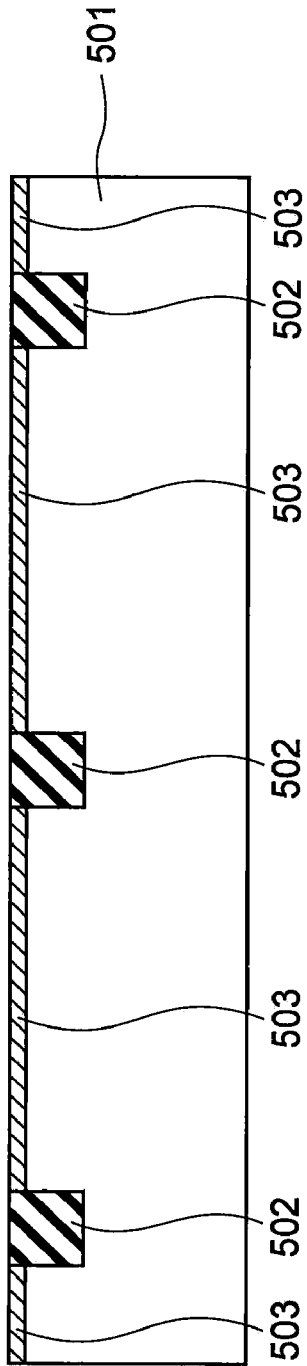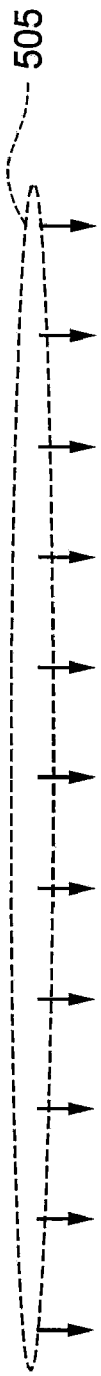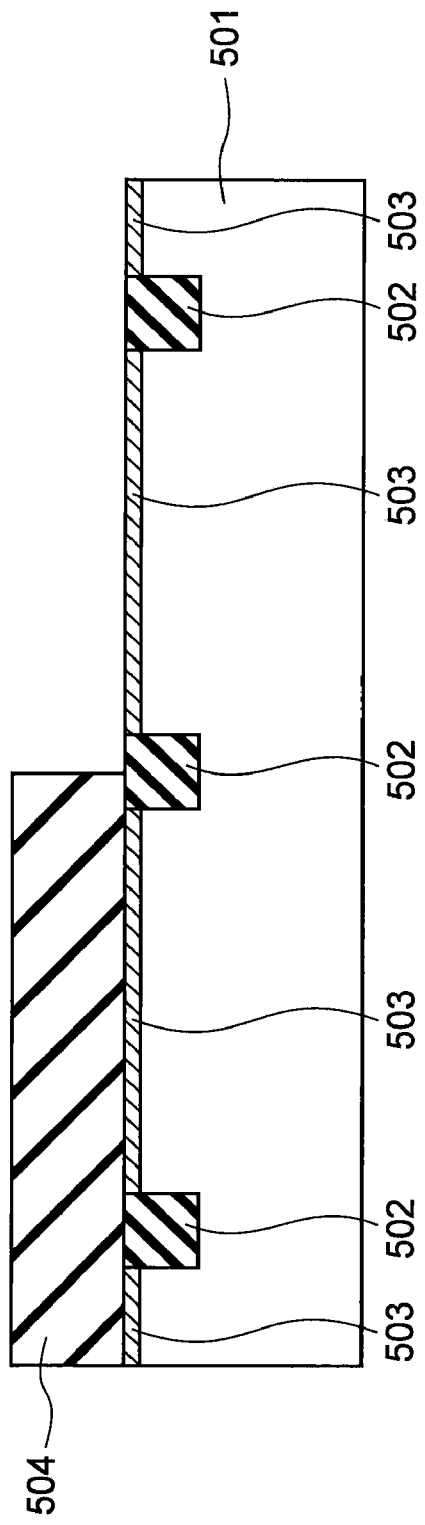
FIG. 8A
FIG. 8B

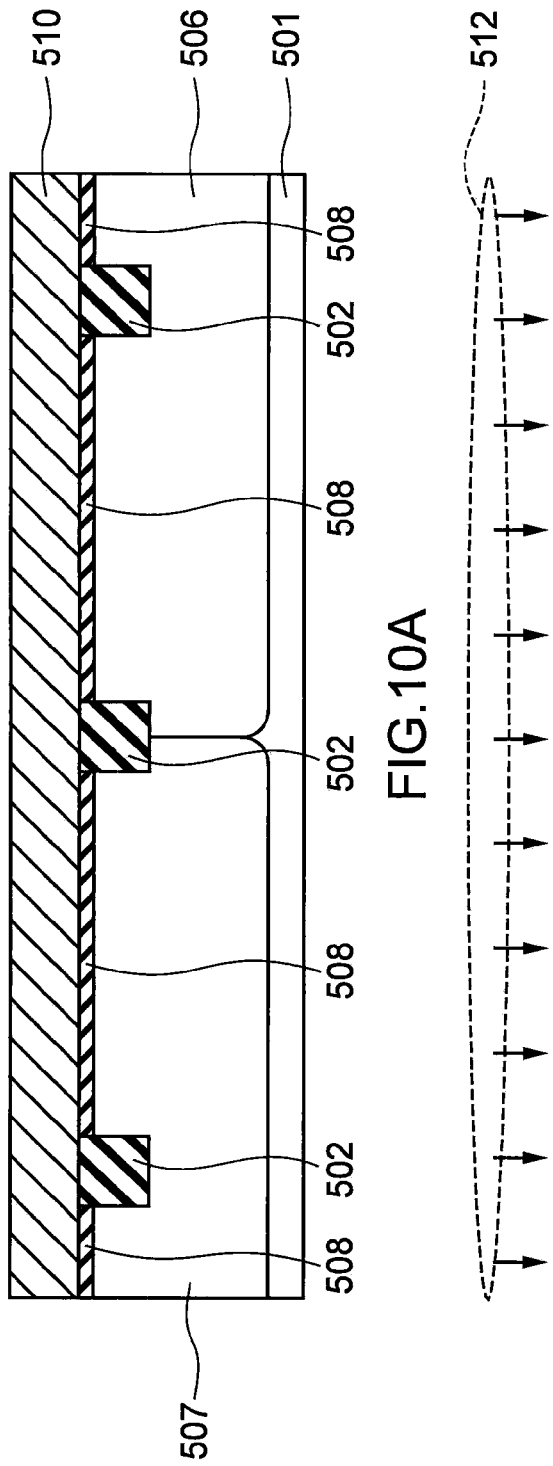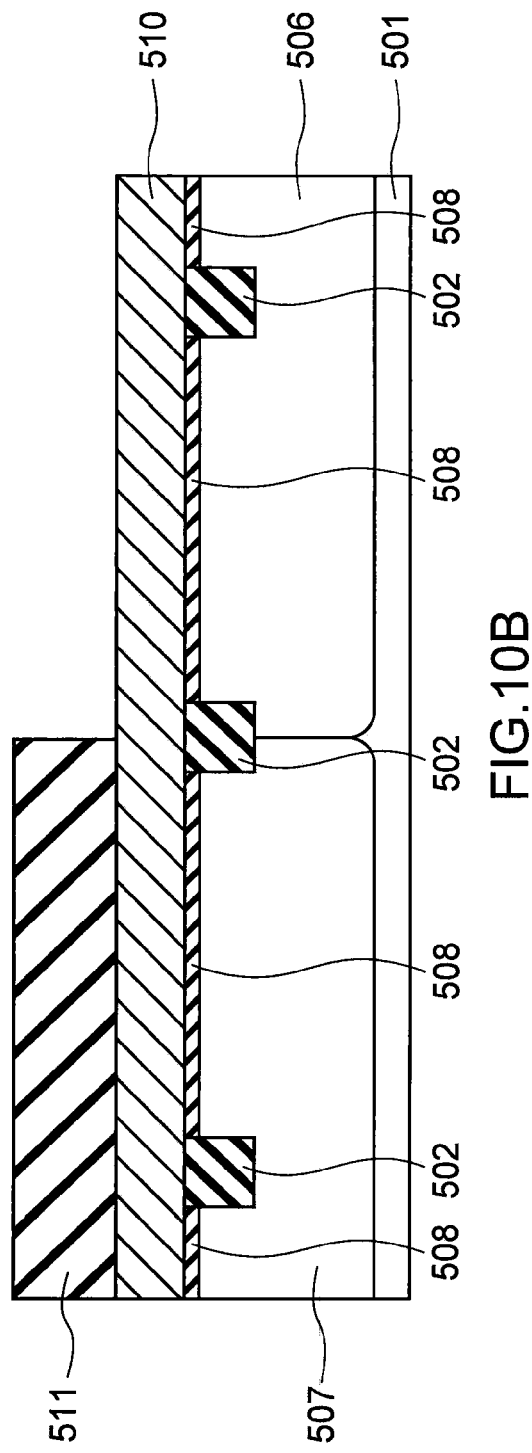

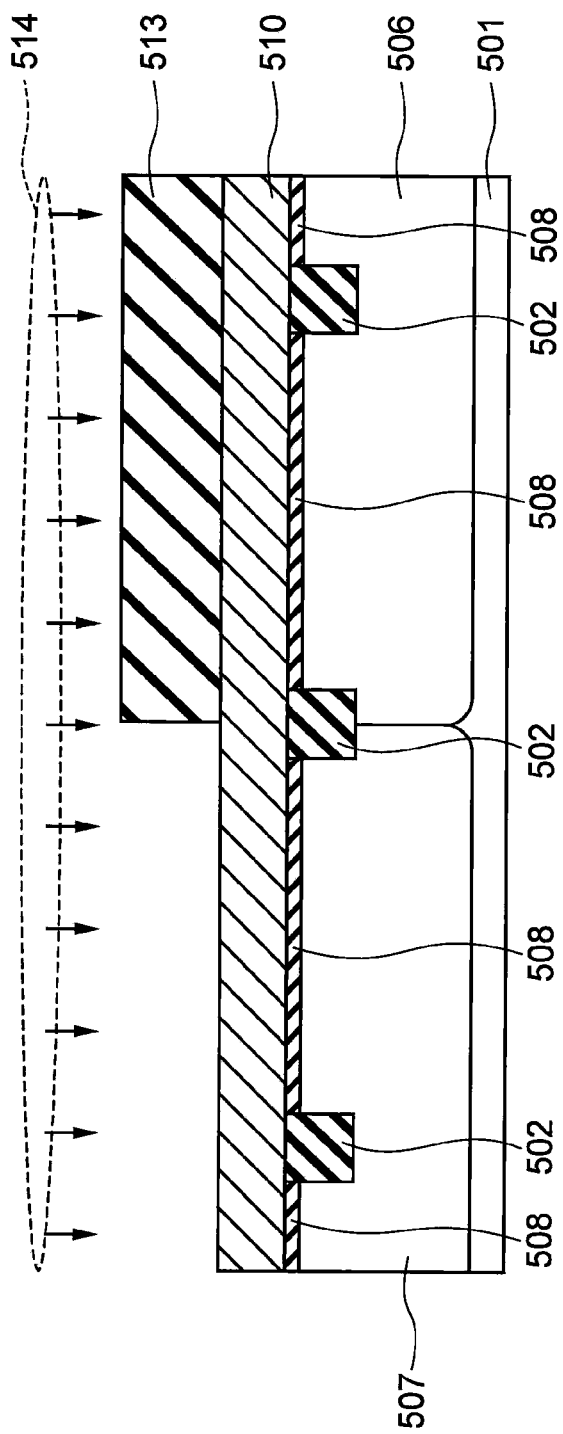
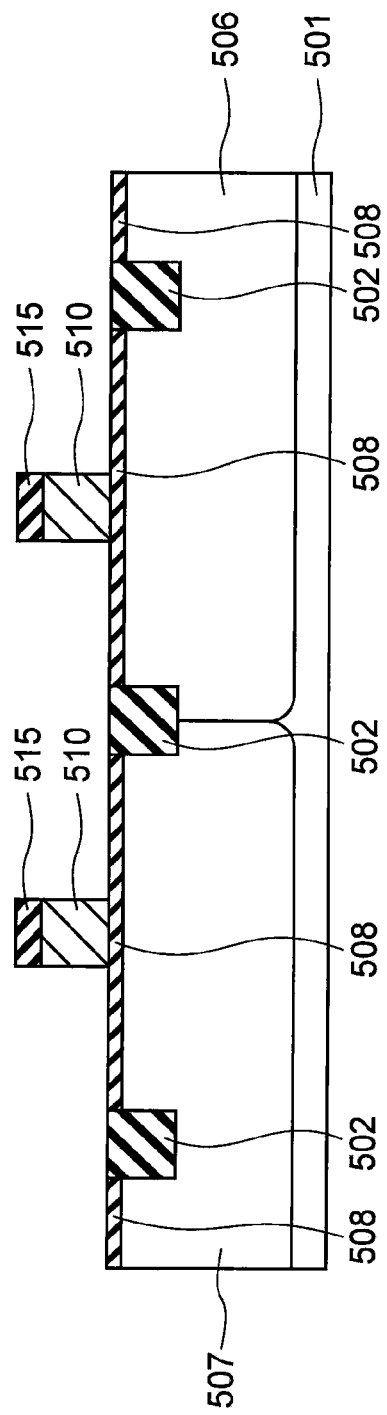
FIG.11A
FIG.11B

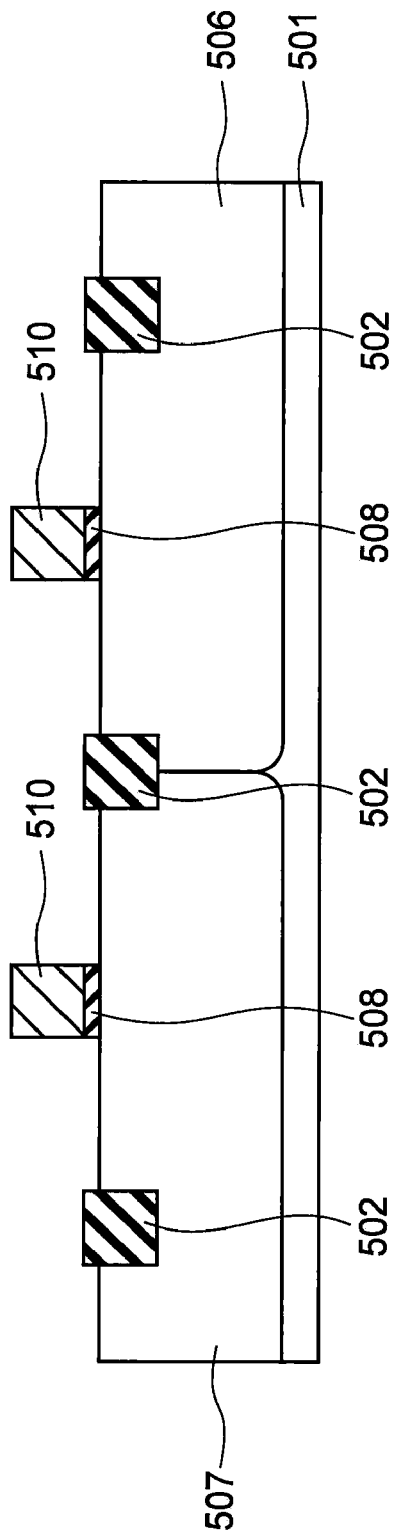
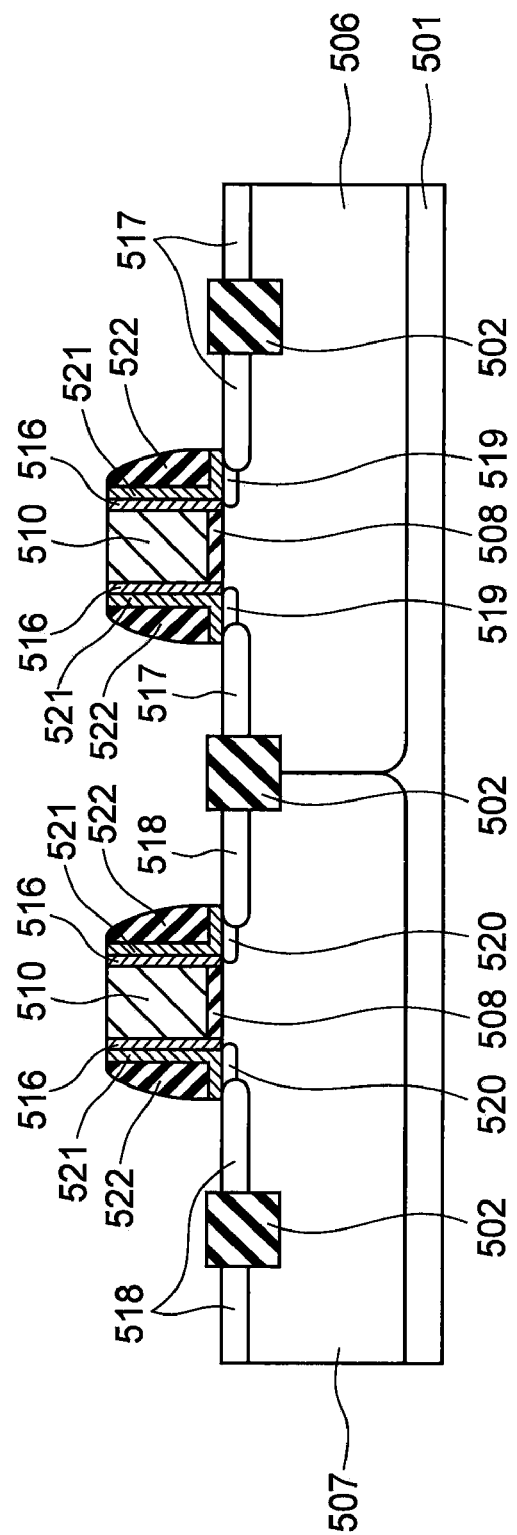
FIG.12A
FIG.12B

METHOD FOR MANUFACTURING SEMICONDUCTOR DEVICE AND THE SEMICONDUCTOR DEVICE

CROSS REFERENCE TO RELATED APPLICATION

This application is based upon and claims the benefit of priority from the prior Japanese Patent Application No. 2008-102318 filed on Apr. 10, 2008 in Japan, the entire contents of which are incorporated herein by reference.

BACKGROUND OF THE INVENTION

1. Field of the Invention

The present invention relates to a method for manufacturing a semiconductor device and the semiconductor device.

2. Related Art

Conventionally, an ALD (Atomic Layer Deposition) method is known as a method to form a silicon oxide film ($SiO_2$ film) which is used in a semiconductor device such as a nonvolatile semiconductor memory device (see, for example, the specification of U.S. Pat. No. 6,391,803 and the pamphlet of International Publication No. 01/040541). The ALD method is a method to deposit a thin film by repeating the steps of supplying a sufficient organic silicon source to cause an adsorption saturation of molecules of the silicon source on a substrate and supplying a sufficient oxidant to remove impurities from the molecules of the silicon source adsorbed on the substrate.

However, the conventional ALD method is unable to deposit a silicon oxide film having a sufficiently low leak current, a high electrical stress resistance, and a high etching resistance.

SUMMARY OF THE INVENTION

According to one aspect of the embodiments of the present invention, there is provided a method for manufacturing a semiconductor device comprising: alternately supplying a silicon source and an oxidant to deposit a silicon oxide film on a surface of a semiconductor substrate, wherein the silicon source is supplied under a supply condition where an adsorption amount of molecules of the silicon source on the semiconductor substrate is increased without causing an adsorption saturation of the molecules of the silicon source on the semiconductor substrate, and wherein the oxidant is supplied under a supply condition where impurities remain in the molecules of the silicon source adsorbed on the semiconductor substrate.

According to another aspect of the embodiments of the present invention, there is provided a method for manufacturing a semiconductor device comprising: alternately supplying a silicon source and an oxidant to deposit a silicon oxide film on a surface of a semiconductor substrate, wherein the silicon source is supplied under a supply condition where a supply time of the oxidant is set shorter than a supply time of the silicon source in each cycle of an alternate supply of the silicon source and the oxidant.

According to a still another aspect of the embodiments of the present invention, there is provided a semiconductor device comprising; at least one of a tunnel insulating film, an inter-poly insulating film, a block insulating film, a side wall insulating film, and a gate insulating film as an insulating film, wherein the at least one of the insulating film is formed with a silicon oxide film deposited by alternately supplying a silicon source and an oxidant, an oxygen/silicon composition ratio of the silicon oxide film being 2.00 to 2.05.

Each of FIGS. 8A to 12B is a sectional view explaining a method for manufacturing a MOS transistor according to a fifth embodiment of the present invention.

Figure 13:
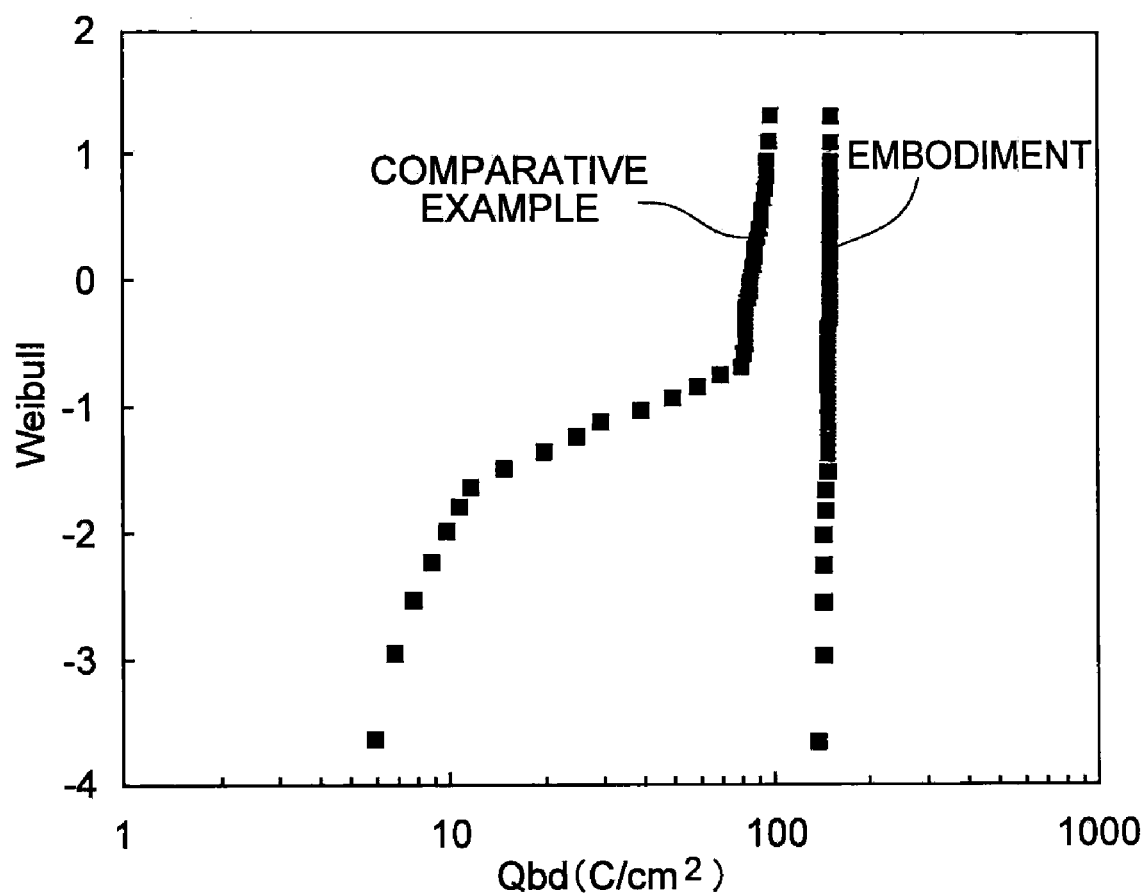

FIG. 13 is a diagram showing the characteristics of the stress resistance of a gate insulating film of the MOS transistor according to the fifth embodiment of the present invention.

DETAILED DESCRIPTION OF THE INVENTION

Before explaining the embodiments of the present invention, how the inventors achieved the present invention will be explained.

The inventors uniquely discovered that the silicon oxide film deposited as in the ALD method explained in the Related Art section has a oxygen-rich composition, the silicon oxide film being deposited by supplying a silicon source under a condition which causes an adsorption saturation of molecules of the silicon source on a substrate and supplying an oxidant under a condition where impurities are sufficiently removed from the molecules of the silicon source adsorbed on the substrate. Concretely, the inventors uniquely discovered that the O/Si (oxygen/silicon) composition ratio of the silicon oxide film deposited by the ALD method is greater than 2.05.

Further, the inventors uniquely discovered that, in comparison with a thermal oxide film, the silicon oxide film having an oxygen-rich composition considerably increases the leak current (mainly tunnel current) in a low electric field, deteriorates the insulation quality after an electrical stress is applied, and deteriorates a withstand voltage.

Based on these unique discoveries, the inventors repeated experiments to improve the characteristics of the silicon oxide film. The following embodiments of the present invention were achieved by the experimental results.

Hereinafter, the embodiments of the present invention will be explained referring to the drawings. These embodiments do not limit the present invention. Note that, in the following explanation, the same symbols are assigned to the components having similar functions and structures and overlapped explanations are omitted except when those are necessary.

In this specification, a silicon oxynitride film represents a silicon oxide film containing nitrogen having a minute amount of 0.1 to 5.0 at. %.

First Embodiment

First, a first embodiment of the present invention will be explained referring to FIGS. 1 to 5D. The first embodiment relates to a method for manufacturing a semiconductor device for depositing a silicon oxynitride film on the surface of a semiconductor substrate.

Figure 1:
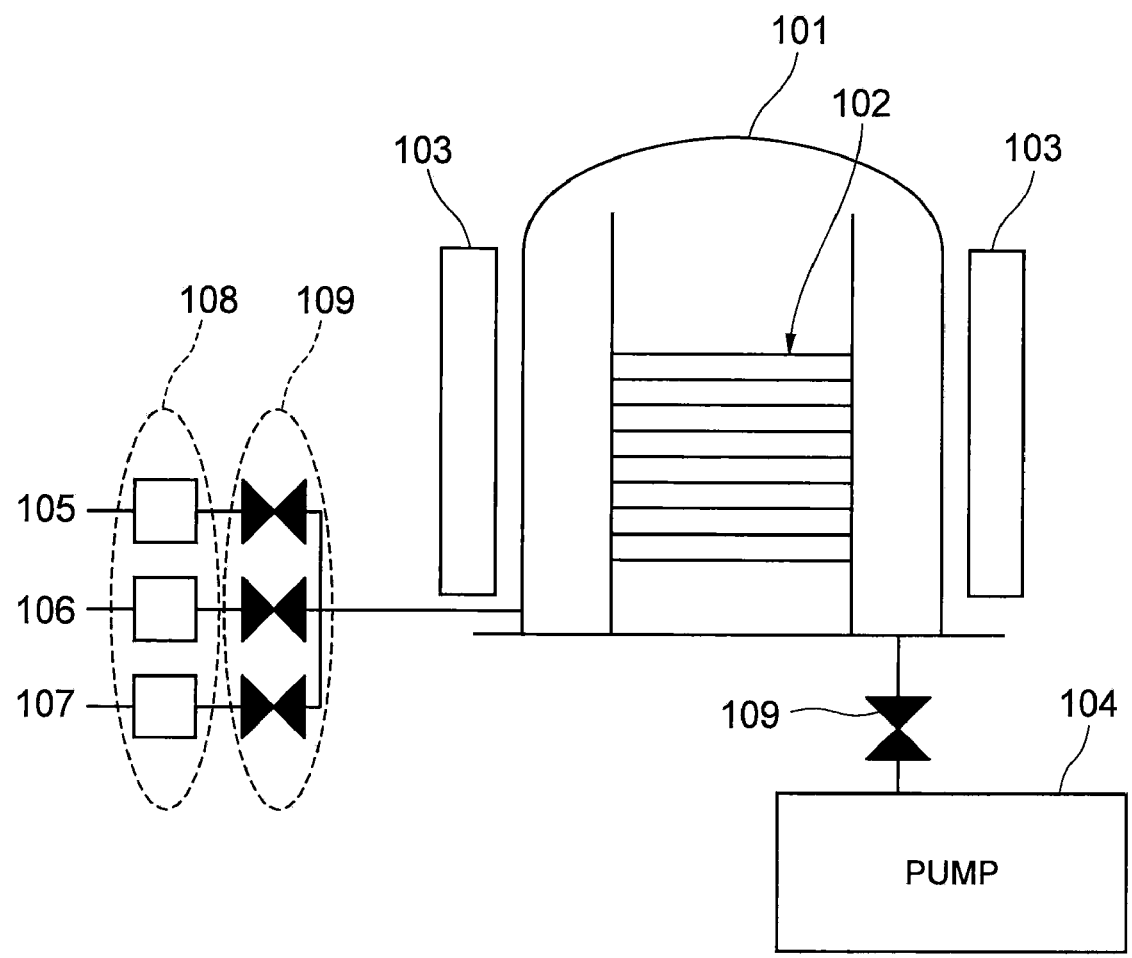
FIG. 1 is a schematic diagram showing a manufacturing device to deposit a silicon oxynitride film according to a first embodiment of the present invention.

FIG. 1 is a schematic diagram showing a manufacturing device to deposit the silicon oxynitride film according to the first embodiment of the present invention.

As shown in FIG. 1, the manufacturing device includes: a decompression container 101; semiconductor substrates 102; a heater 103; a vacuum pump 104; a silicon source 105; an oxidant 106; an inert gas 107; MFCs (mass flow controllers) 108; and valves 109.

Note that an aminosilane type silicon source (nitrogen-containing silicon source), for example, is used as the silicon source 105. Silicon substrates, for example, are used as the semiconductor substrates 102.

Next, the method for manufacturing the semiconductor device for depositing the silicon oxynitride film on the surface of the semiconductor substrate according to the first embodiment will be explained referring to FIG. 2.

Figure 2:
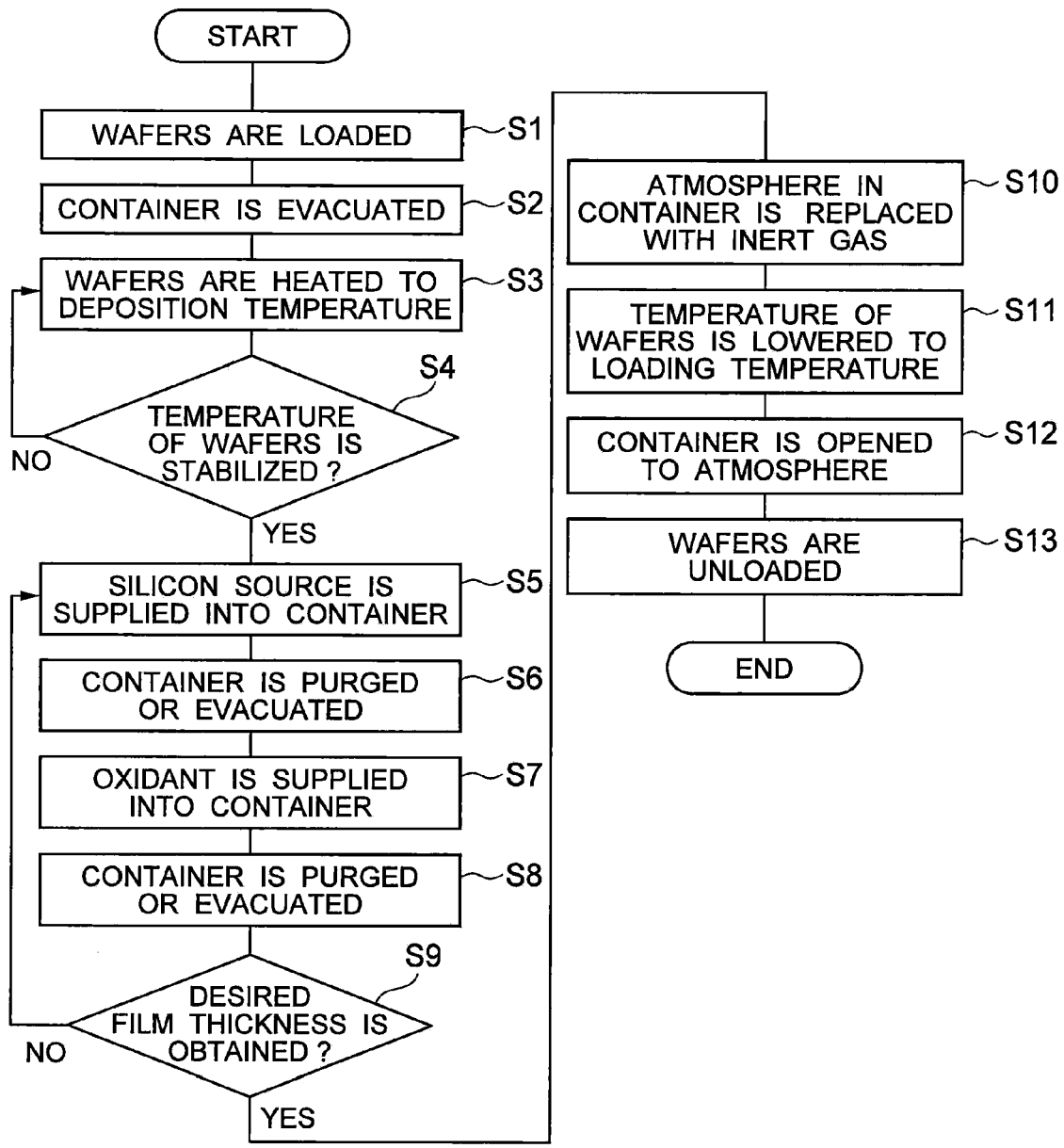
FIG. 2 is a flow chart showing a method to deposit the silicon oxynitride film according to the first embodiment of the present invention.

FIG. 2 is a flow chart showing a method to deposit the silicon oxynitride film according to the first embodiment.

First, the semiconductor substrates 102 are loaded into the decompression container 101 (wafers are loaded; a step S1).

Next, the decompression container 101 is evacuated by using the vacuum pump 104 to be decompressed once (a step S2). After that, nitrogen is supplied into the decompression container 101, by which the inside pressure of the decompression container 101 is adjusted to be 1 to 10 Torr with a nitrogen atmosphere being maintained in the decompression container 101.

Next, the semiconductor substrates 102 are heated by using the heater 103 (a step S3).

After that, whether or not the temperature of the semiconductor substrates 102 is stabilized at a predetermined deposition temperature between 300° C. to 600° C. is judged (a step S4). Here, in the case where the temperature is not stabilized at the predetermined temperature, the flow returns to the step S3 to continue heating the semiconductor substrates 102 (the step S4; No).

On the other hand, in the case where the temperature of the semiconductor substrates 102 is stabilized at the above predetermined temperature (the step S4; Yes), the flow proceeds to a step S5.

Next, the silicon source 105 is supplied through the MFC 108 and the valve 109 into the decompression container 101 (the step S5).

Then, a predetermined amount of the silicon source 105 is supplied into the decompression container 101 for a predetermined time. After a predetermined amount of silicon source molecules are adsorbed on the semiconductor substrates 102, the inside of the decompression container 101 is purged with the inert gas 107. Alternatively, the inside of the decompression container 101 is evacuated by using the vacuum pump 104 (a step S6).

After that, the oxidant 106 is supplied through the MFC 108 and the valve 109 into the decompression container 101 (a step S7).

Then, a predetermined amount of the oxidant 106 is supplied into the decompression container 101 for a predetermined time. After the oxidation amount of the silicon source molecules adsorbed on the semiconductor substrates 102 reaches a predetermined amount, the inside of the decompression container 101 is purged with the inert gas 107. Alternatively, the inside of the decompression container 101 is evacuated by using the vacuum pump 104 (a step S8).

Through the steps S5 to S8, silicon oxynitride films are deposited on the surfaces of the semiconductor substrates 102.

Here, a series of the process steps S5 to S8 are repeated until the films have a predetermined desired film thickness (a step S9; No).

Then, when the silicon oxynitride films have the desired film thickness, the above alternate supply of the silicon source 105 and the oxidant 106 is stopped (the step S9; Yes).

Note that although the supply of the silicon source 105 (the step S5) and the supply of the oxidant 106 (the step S7) are explained above as one of the characteristics of the first embodiment, the details thereof will be explained later.

Next, the decompression container 101 is purged with nitrogen after the decompression container 101 is evacuated by using the vacuum pump 104. The evacuation and the nitrogen purge are repeated, by which the atmosphere in the decompression container 101 is replaced with the inert gas (nitrogen) to return to the nitrogen atmosphere (a step S10).

Next, the temperature of the semiconductor substrates 102 is lowered to around a room temperature (loading temperature) (a step S11).

After that, the decompression container 101 is opened to the atmosphere (a step S12). In the last, the semiconductor substrates 102 are taken out from the decompression container 101 (wafers are unloaded; a step S13).

Next, referring to FIGS. 3A and 3B, the supply of the silicon source (the step S5) and the supply of the oxidant (the step S7) as stated above will be explained in detail compared to the ALD method.

Figure 3A:
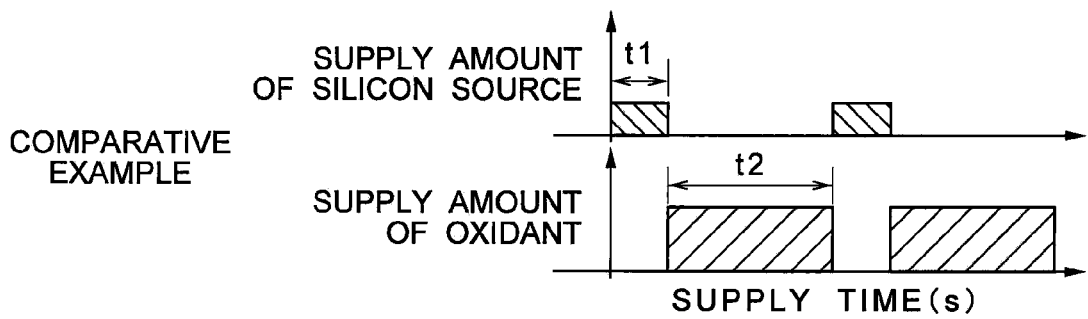
FIG. 3A is a diagram showing the relationship between the supply amounts of a silicon source and an oxidant and the supply times thereof in an ALD method as a comparative example.

FIG. 3A is a diagram showing the relationship between the supply amounts of the silicon source and the oxidant and the supply times thereof in the ALD method. FIG. 3B is a diagram showing the relationship between the supply amounts of the silicon source and the oxidant and the supply times thereof in the manufacturing method according to the first embodiment.

In FIG. 3A, a t1 represents the supply time of the silicon source in the ALD method, while a t2 represents the supply time of the oxidant in the ALD method.

Figure 3B:
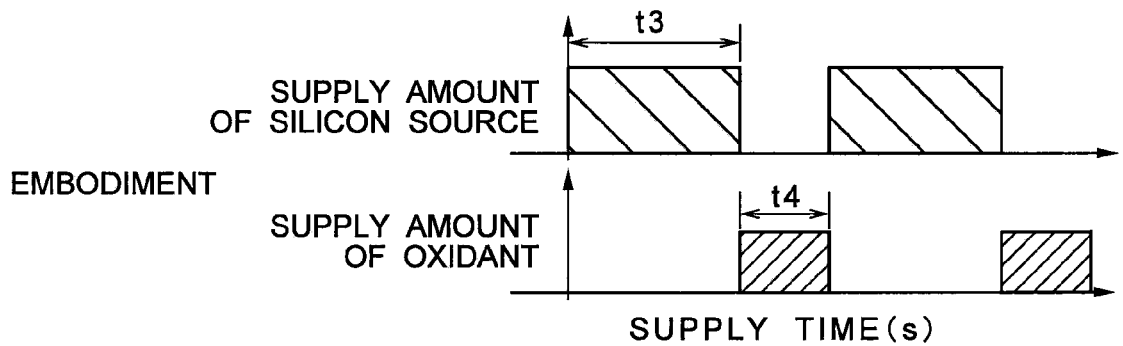
FIG. 3B is a diagram showing the relationship between the supply amounts of the silicon source and the oxidant and the supply times thereof in a manufacturing method according to the first embodiment of the present invention.

In FIG. 3B, a t3 represents the supply time of the silicon source in the manufacturing method according to the first embodiment, while a t4 represents the supply time of the oxidant in the manufacturing method according to the first embodiment.

In the ALD method shown as a comparative example in FIG. 3A, the silicon source is supplied under a condition which causes an adsorption saturation of the silicon source molecules. The adsorption saturation represents the state where the adsorption amount cannot be increased to become constant even if the supply time t1 of the silicon source is further increased. Conditions such as the temperature of the substrate, kind of the silicon source, and form of the decompression container are set so as to cause the adsorption saturation of the silicon source molecules.

In addition, in the ALD method, the oxidant is supplied under a condition where impurities are sufficiently removed from the silicon source molecules adsorbed on the surface of the semiconductor substrate. In other words, the supply of the oxidant is stopped when the oxidation is sufficiently performed and the oxidation amount cannot be increased to become constant even if the supply time t2 of the oxidant is further increased.

Note that the adsorption amount represents the number of the silicon source molecules adsorbed per unit area. The oxidation amount represents the number of the silicon source molecules which are oxidized.

On the other hand, in the manufacturing method according to the first embodiment, the silicon source is supplied under a supply condition where an adsorption amount of molecules of the silicon source on the semiconductor substrate is increased as the supply time of the silicon source is increased without causing the adsorption saturation of the molecules of the silicon source on the semiconductor substrate.

In other words, after the silicon source molecules are adsorbed on the surface of the semiconductor substrate to form a monolayer, the silicon source molecules continue being adsorbed on the monolayer. Note that the adsorption amount of the silicon source molecules per unit time is smaller than that in a generally used CVD (Chemical Vapor Deposition) method.

The above adsorption condition is, for example, that: (1) the supply time of the silicon source is longer than that in the ALD method; (2) the temperature of the semiconductor substrate is higher than that in the ALD method by 50 to 100° C.; (3) the supply amount of the silicon source is greater than that in the ALD method; and (4) the supply pressure of the silicon source is higher than that in the ALD method.

The oxidant is supplied under a supply condition where impurities remain in the silicon source molecules adsorbed on the semiconductor substrate. In other words, the supply of the oxidant is stopped with the oxidation amount being increased. The supply condition is, for example, that the supply time t4 of the oxidant is set to be considerably shorter than the supply time t3 of the silicon source in each cycle of the alternate supply of the silicon source and the oxidant. As a result, the oxidation amount of the film is decreased, by which the impurities (for example, nitrogen, carbon, or hydrogen) contained in the silicon source remain in the film.

As stated above, by deliberately making impurities remain in the film, adsorption sites can be increased when the silicon source molecules are adsorbed in the next process (the step S5). With the increase in the adsorption sites, a greater amount of silicon source molecules than in the ALD method are adsorbed on the film in the next process.

Therefore, the O/Si composition ratio of the silicon oxynitride film deposited by the ALD method is inclined to be oxygen-rich, while that in the manufacturing method according to the first embodiment becomes closer to a stoichiometry ratio (O/Si composition ratio=2.00).

More specifically, the O/Si composition ratio of the silicon oxynitride film deposited by the manufacturing method according to the first embodiment is 2.00 to 2.05.

The silicon oxynitride film contains nitrogen having a minute amount of 0.1 to 5.0 at. %. The nitrogen is included in the impurities remaining in the film.

Next, the electric characteristics of the silicon oxynitride film deposited by the manufacturing method according to the first embodiment will be explained referring to FIGS. 4 and 5A to 5D.

Figure 4:
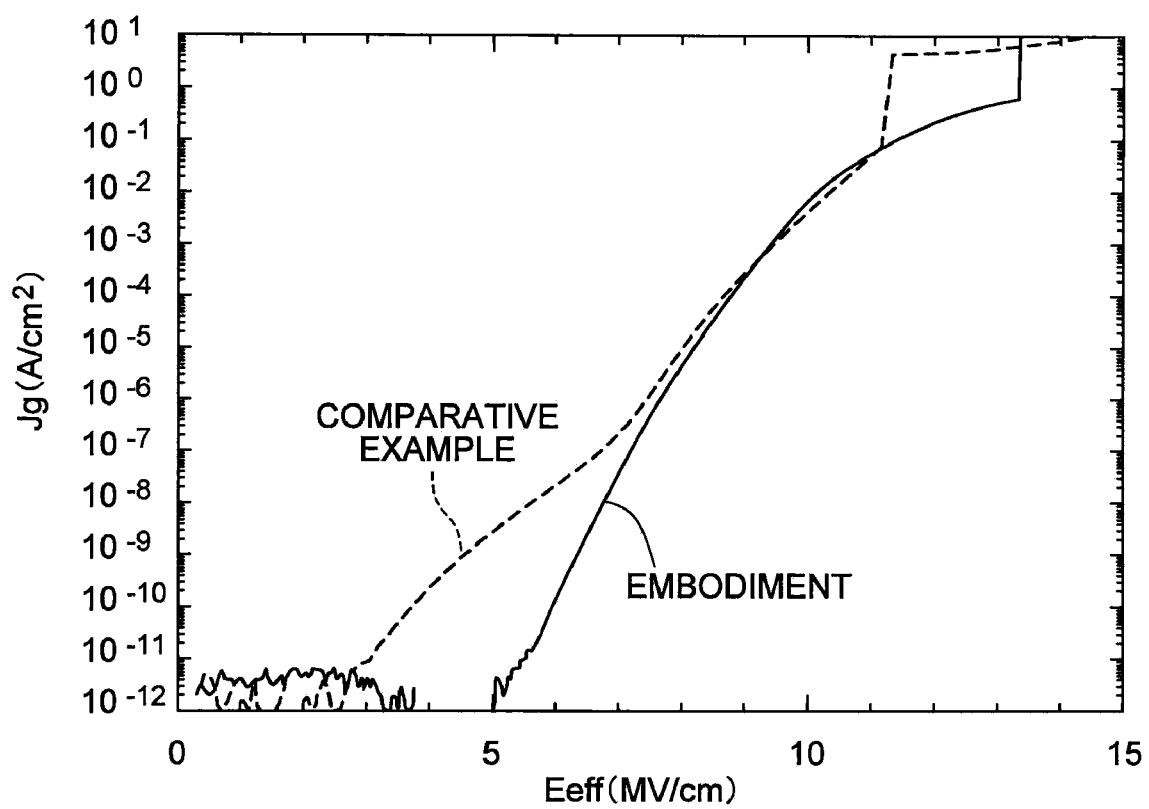
FIG. 4 is a diagram showing the electric field dependent characteristics of the electric current density of the silicon oxynitride film according to the first embodiment of the present invention.

FIG. 4 is a diagram showing the electric field dependent characteristics of the leak electric current density of the silicon oxynitride film according to the first embodiment.

In FIG. 4, the solid line shows the characteristics of the silicon oxynitride film (O/Si composition ratio is 2.05 or less) according to the first embodiment. The broken line shows the characteristics of the silicon oxide film deposited by the ALD method shown as a comparative example (O/Si composition ratio is about 2.1).

The horizontal axis in FIG. 4 shows the electric field (MV/cm) applied to the silicon oxynitride film. The vertical axis shows the leak current density (A/cm$^2$).

Note that the characteristics of a thermal oxide film are substantially same as the characteristics shown by the solid line (not shown).

As shown in FIG. 4, the leak current of the silicon oxide film deposited by the ALD method increases greater than the thermal oxide film in the range where the electric field is 7 MV/cm or less.

On the other hand, the leak current characteristics of the silicon oxynitride film deposited by the manufacturing method according to the first embodiment are equivalent to those of the thermal oxide film.

In other words, in the manufacturing method according to the first embodiment, the leak current characteristics of the silicon oxynitride film can be considerably improved compared to those in the ALD method, by which a low leak current can be achieved.

Next, the relationship between the leak current and the O/Si composition ratio etc. of the silicon oxynitride film will be explained referring to FIGS. 5A to 5D.

Figure 5A:
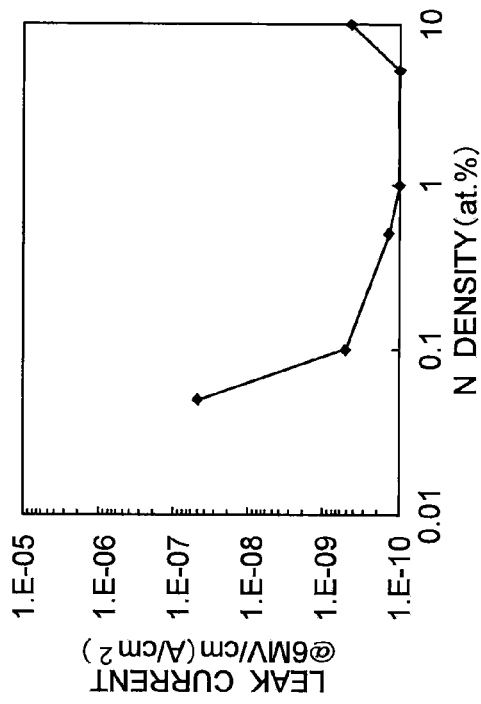
FIG. 5A is a diagram showing the O/Si composition ratio dependent characteristics of the leak current of the silicon oxynitride film according to the first embodiment of the present invention.
Figure 5B:
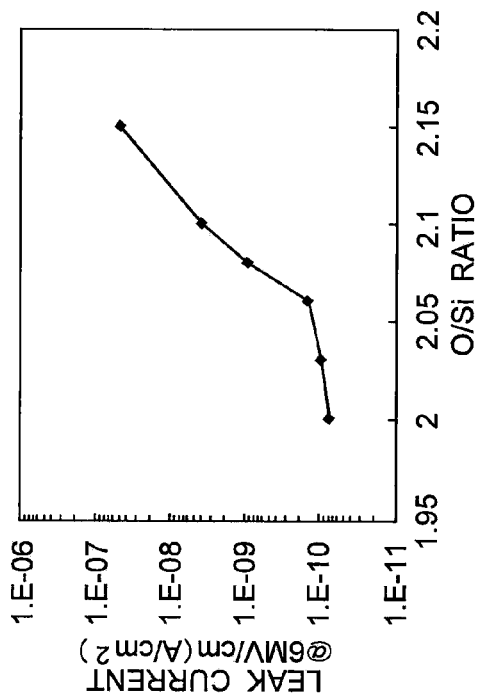
FIG. 5B is a diagram showing the N density dependent characteristics of the leak current of the silicon oxynitride film according to the first embodiment of the present invention.

FIG. 5A is a diagram showing the O/Si composition ratio dependent characteristics of the leak current. FIG. 5B is a diagram showing the N (nitrogen) density dependent characteristics of the leak current.

Figure 5C:
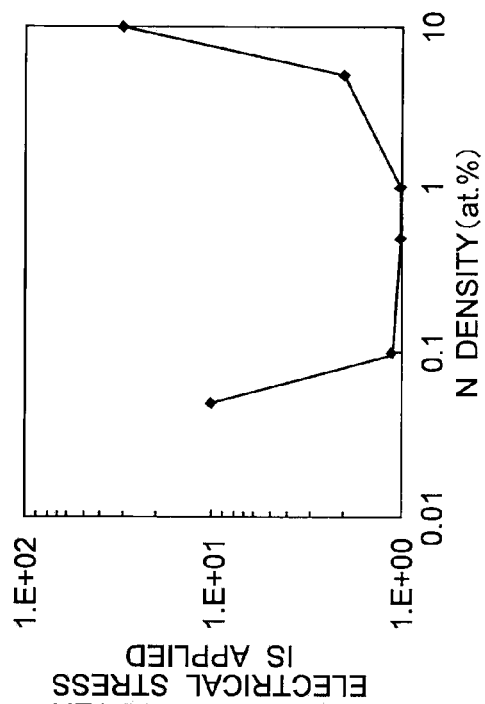
FIG. 5C is a diagram showing the O/Si composition ratio dependent characteristics of the leak current ratio of the silicon oxynitride film before and after being applied with an electrical stress according to the first embodiment of the present invention.
Figure 5D:
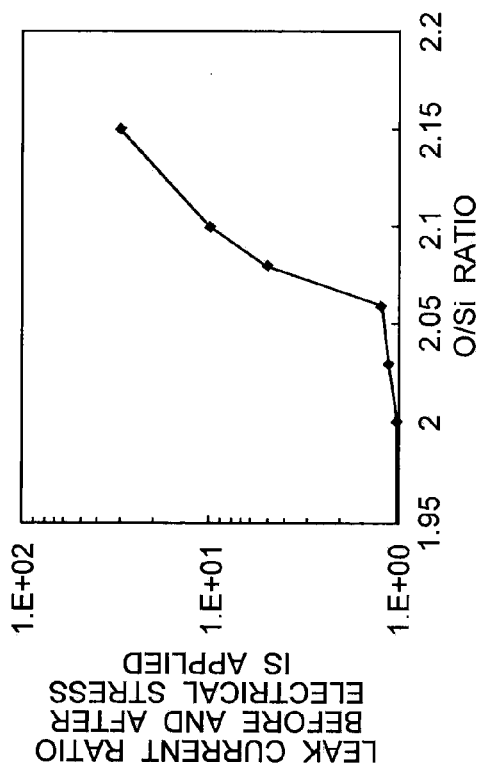
FIG. 5D is a diagram showing the N density dependent characteristics of the leak current ratio of the silicon oxynitride film before and after being applied with the electrical stress according to the first embodiment of the present invention.

FIG. 5C is a diagram showing the O/Si composition ratio dependent characteristics of the leak current ratio before and after an electrical stress is applied. Further, FIG. 5D is a diagram showing the N density dependent characteristics of the leak current ratio before and after the electrical stress is applied.

Note that the leak current ratio before and after the electrical stress is applied represents (the leak current value after the electrical stress is applied)/(the leak current value before the electrical stress is applied).

FIGS. 5A to 5D show the characteristics in the case where an electric field of 6 MV/cm is applied to the silicon oxynitride film.

As shown in FIGS. 5A to 5D, the leak current is interrelated with the O/Si composition ratio and the N density of the silicon oxynitride film deposited.

Concretely, as shown in FIGS. 5A and 5C, the leak current decreases as the O/Si composition ratio becomes closer to 2.00. The leak current ratio before and after the electrical stress is applied becomes closer to 1 as the O/Si composition ratio becomes closer to 2.00, by which the leak current due to the electrical stress is decreased.

More specifically, in the case where the O/Si composition ratio is 2.00 to 2.05, the leak current, which includes the leak current due to the electrical stress, decreases.

On the other hand, in the case where the O/Si composition ratio is greater than 2.05, the leak current, which includes the leak current due to the electrical stress, increases.

In the case where the O/Si composition ratio is less than 2.00 (silicon rich), the leak current, which includes the leak current due to the electrical stress, increases (not shown).

Further, as shown in FIGS. 5B and 5D, the leak current decreases as the N density becomes closer to the range from 0.1 to 5.0 at. %. In the range, the leak current ratio before and after the electrical stress is applied becomes closer to 1, while the leak current due to the electrical stress decreases.

On the other hand, in the case where the N density is less than 0.1 at. % or greater than 5.0 at. %, the leak current, which includes the leak current due to the electrical stress, increases.

Further, the silicon oxynitride film deposited by the manufacturing method according to the first embodiment, the silicon oxynitride film having a minute amount of N (its density is 0.1 to 5.0 at. %) and an O/Si composition ratio of about 2, has a high wet etching resistance and a high dry etching resistance to effectively decreases an etching rate to about one-half to two-third.

As stated above, in the method for manufacturing the semiconductor device according to the first embodiment, the silicon oxynitride film having an O/Si composition ratio of 2.00 to 2.05 and an N density of 0.1 to 5.0 at. % can be deposited at a lower temperature than the deposition temperature in the CVD method. This silicon oxynitride film has a sufficiently low leak current, a high electrical stress resistance, and a high etching resistance.

Second Embodiment

Next, a second embodiment of the present invention will be explained referring to FIGS. 6A and 6B.

The second embodiment relates to a nonvolatile semiconductor memory device using the silicon oxynitride film deposited by the manufacturing method according to the first embodiment.

First, a MONOS (Metal-Oxide-Nitride-Oxide-Semiconductor) type cell in which a single-layered silicon oxynitride film is used as a tunnel isolation film will be explained as an example.

Figure 6B:
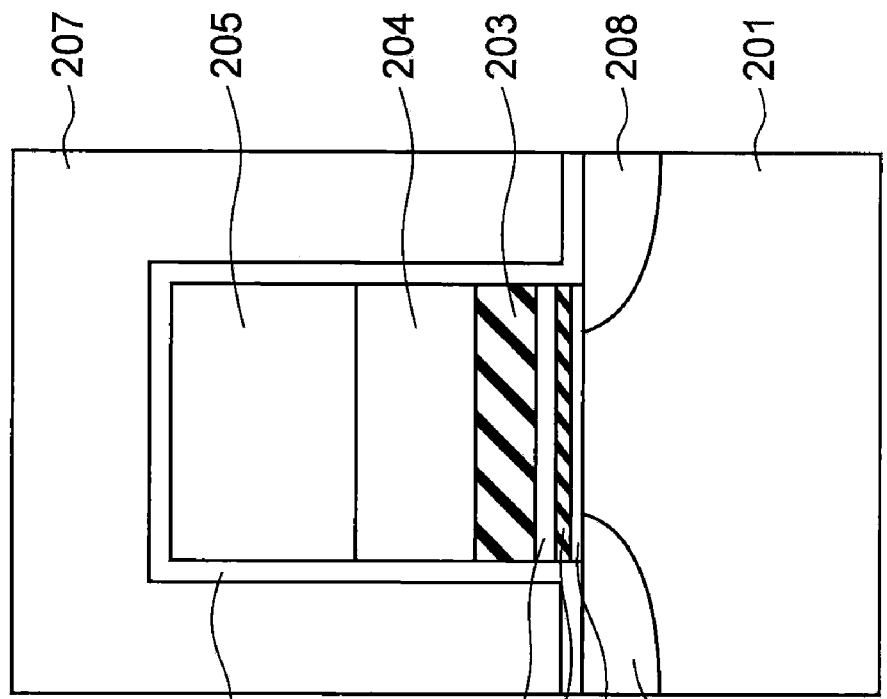
FIG. 6B is a sectional view schematically showing the main part of the MONOS type cell whose tunnel isolation film has a multilayer structure according to the second embodiment of the present invention.
Figure 6A:
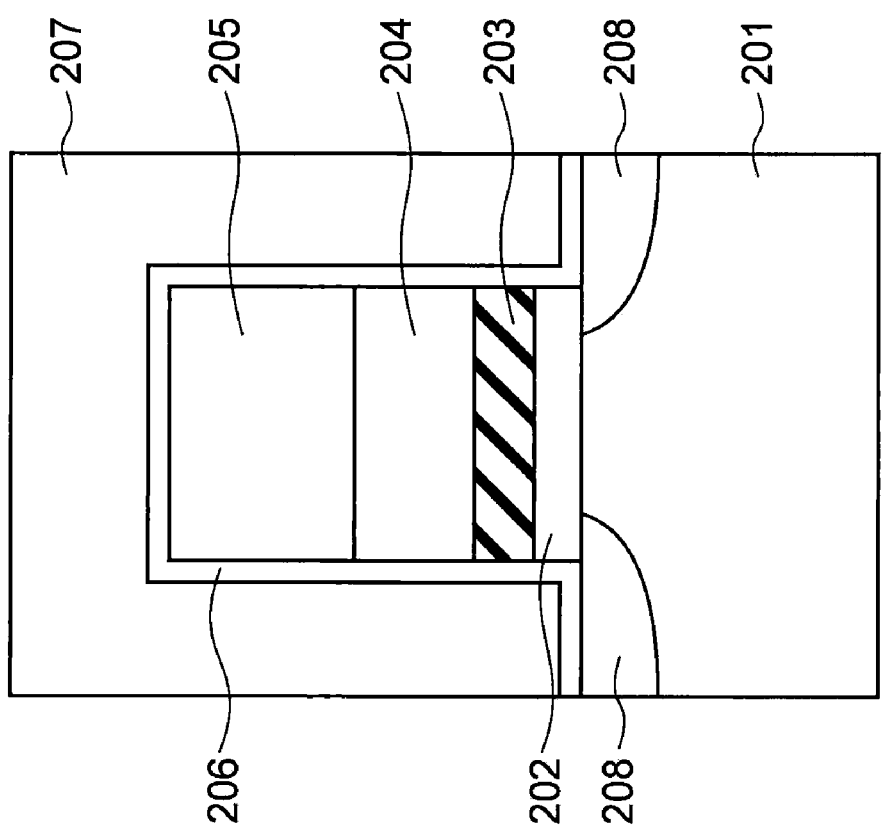
FIG. 6A is a sectional view schematically showing the main part of a MONOS type cell according to a second embodiment of the present invention.

FIG. 6A is a sectional view schematically showing the main part of the MONOS type cell according to the second embodiment of the present invention. The MONOS type cell is a cell transistor included in the nonvolatile semiconductor memory device.

As shown in FIG. 6A, the MONOS type cell includes: a silicon substrate 201; a silicon oxynitride film (tunnel isolation film) 202; a silicon nitride film (charge accumulation layer; SiN film) 203; a silicon oxynitride film (block insulating film) 204; a polysilicon electrode (control gate electrode) 205; a side wall insulating film 206; a interlayer insulating layer 207; and impurities diffusion regions (source and drain regions) 208.

Next, a method for manufacturing the MONOS type cell according to the second embodiment will be explained.

First, an element isolation region (not shown) is formed on the silicon substrate 201 by using a shallow trench isolation (not shown). Next, ion is implanted to be activated in the region for an element, and a well region (not shown) is formed.

Next, the surface of the silicon substrate 201 on which the element isolation region is formed is cleaned by using a diluted hydrofluoric acid. After that, the silicon oxynitride film 202 having a predetermined thickness of 2 to 6 nm is deposited as a tunnel isolation film by using the manufacturing method according to the first embodiment of the present invention.

After that, the deposited silicon oxynitride film 202 is exposed to an NO atmosphere at 700 to 900° C. In the process, nitrogen is further introduced to the silicon oxynitride film 202, by which the improvement in the electrical stress resistance can be further expected.

Next, the silicon nitride film 203 having a predetermined thickness of 5 to 10 nm is deposited on the silicon oxynitride film 202 as a charge accumulation layer in an atmosphere of DCS (dichlorosilane) and $NH_3$ by using an LPCVD (Low Pressure Chemical Vapor Deposition) method.

Further, the silicon oxynitride film 204 having a predetermined thickness of 6 to 15 nm is deposited on the silicon nitride film 203 as a block insulating film by using the manufacturing method according to the first embodiment.

After that, the polysilicon electrode 205 is formed on the silicon oxynitride film (block insulating film) 204, by which the MONOS type cell is completed. Note that the explanation as to the formation of a wiring layer etc. is omitted.

Here, the charge retention characteristics of the MONOS type cell after being applied with the electrical stress due to writing and erasing can be considerably improved by using the silicon oxynitride film according to the first embodiment as the tunnel isolation film and the block insulating film. The effect results from the fact that the silicon oxynitride film according to the first embodiment has a restrained leak current in the low electric field and a high electrical stress resistance compared to the silicon oxide film deposited by the ALD method.

The writing window of the MONOS type cell can be improved by using the silicon oxynitride film according to the first embodiment as the block insulating film. The effect results from the fact that the oxidation of the silicon nitride film 203 serving as a charge accumulation layer is restrained by supplying a small amount of the oxidant to deposit the block insulating film.

Next, a tunnel isolation film having a multilayer structure will be explained an example.

FIG. 6B is a sectional view schematically showing the main part of the MONOS type cell whose tunnel isolation film has the multilayer structure according to the second embodiment of the present invention.

As shown in FIG. 6B, the MONOS type cell includes: a silicon oxide film 202*a* (having a predetermined thickness of 1 to 2.5 nm) as a tunnel isolation film; a silicon nitride film 202*b* (having a predetermined thickness of 1 to 4 nm); and a silicon oxynitride film 202*c* (having a predetermined thickness of 1 to 2.5 nm).

The other structures are the same as the structure shown in FIG. 6A.

Next, the method to form the tunnel isolation film having the multilayer structure will be explained.

The silicon oxide film 202*a* is formed by, for example, exposing the surface of a cleaned silicon substrate to an oxidizing atmosphere at 800 to 1000° C. Note that the formed silicon oxide film may be introduced with nitrogen in an atmosphere of NO gas at 700 to 900° C.

Alternatively, the silicon oxide film 202a may be deposited by the manufacturing method according to the first embodiment of the present invention.

Next, the silicon nitride film 202b is deposited by the LPCVD method using DCS and NH$_3$. Instead, the silicon nitride film 202 b may be deposited by the ALD method using DCS and N* (nitrogen radical). Here, the ALD method, which has a superior thin film controllability, is desirable.

After that, the manufacturing method according to the first embodiment of the present invention is used to deposit the silicon oxynitride film 202c on the silicon nitride film 202b.

The explanation as to the method to form the other layers is omitted.

In this case, the supply amount of the oxidant is small particularly in the process to deposit the silicon oxynitride film 202c on the silicon nitride film 202b, by which the oxidation of the silicon nitride film 202b is restrained. Therefore, in the second embodiment, the injection efficiency of electrons and holes is improved, by which the writing and erasing speed of the MONOS type cell can be improved.

Note that although in the second embodiment the silicon oxynitride film according to the first embodiment is used as the tunnel isolation film of the MONOS type cell to show an example, an effect similar to the above effect can be obtained if the silicon oxynitride film is used as the tunnel isolation film of an FG (Floating Gate) type cell.

Third Embodiment

Next, a third embodiment of the present invention will be explained referring to FIGS. 7A and 7B.

The third embodiment is an example in which the silicon oxynitride film deposited by the manufacturing method according to the first embodiment of the present invention is used as an interelectrode insulating film (inter-poly insulating film) of an FG type cell.

Figures 7A, 7B:
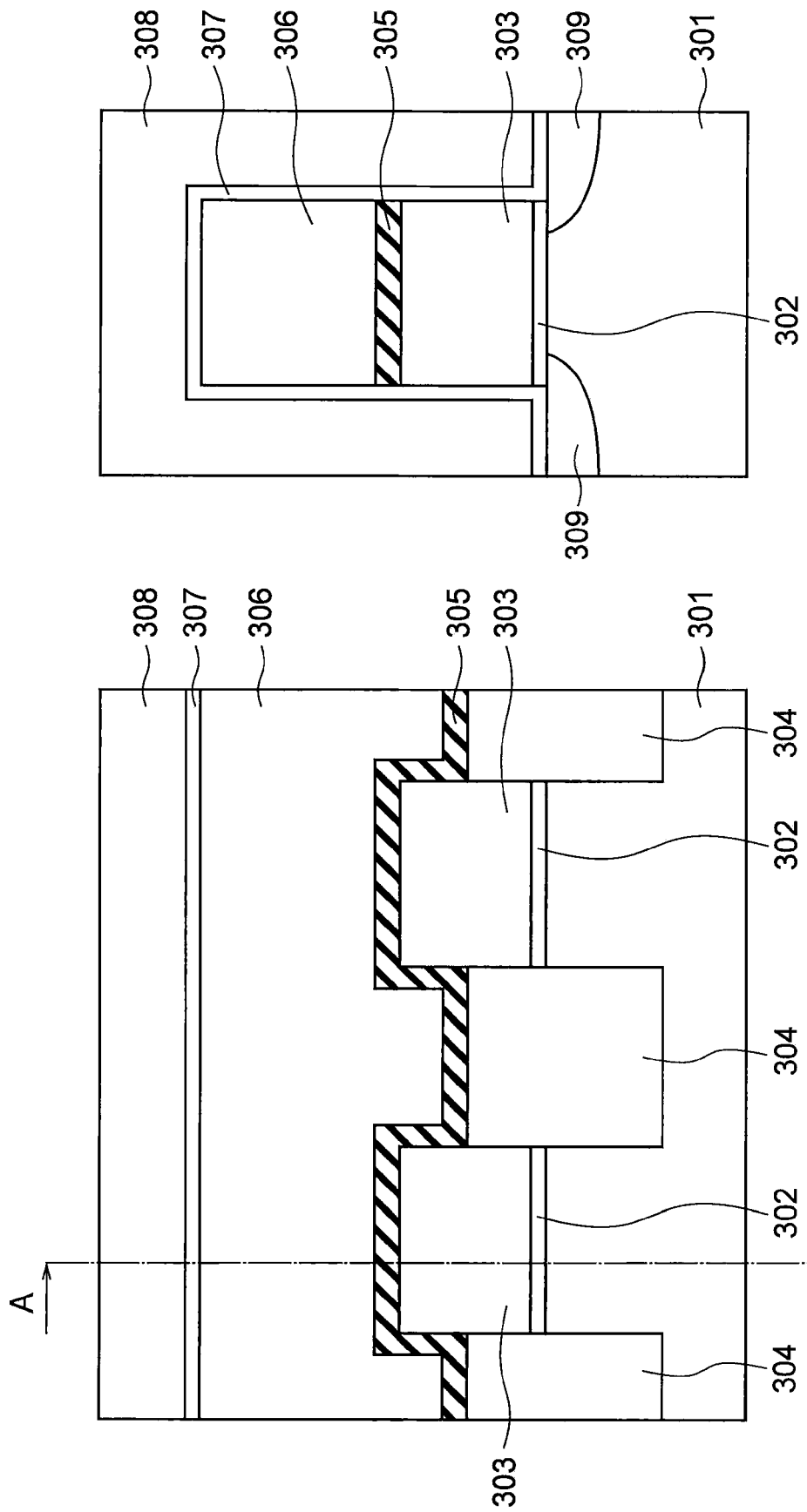
FIG. 7A is a sectional view schematically showing the main part of an FG type cell in the channel width direction according to a third embodiment of the present invention.
FIG. 7B is a sectional view taken along the line A-A' of FIG. 7A.

Each of FIGS. 7A and 7B is a sectional view schematically showing the main part of the FG type cell according to the third embodiment of the present invention. The FG type cell is a cell transistor included in a nonvolatile semiconductor memory device.

FIG. 7A is a sectional view of the FG type cell in the channel width direction. FIG. 7B is a sectional view taken along the line A-A' of FIG. 7A.

As shown in FIGS. 7A and 7B, the FG type cell includes: a silicon substrate 301; a tunnel isolation film (first insulating film) 302; a floating gate electrode (first electrically conductive layer) 303; a shallow trench isolation 304; an interelectrode insulating film (second insulating film) 305; a control gate electrode (second electrically conductive layer) 306; a side wall insulating film 307; an interlayer insulating layer 308; and impurities diffusion regions (source and drain regions) 309.

The interelectrode insulating film 305 has a layered structure formed of a silicon oxynitride film 305a, a silicon nitride film 305b, and a silicon oxynitride film 305c (not shown).

Here, the charge loss of the silicon nitride film 305b due to the leak current in the low electric field is restrained by depositing the silicon oxynitride film 305a and the silicon oxynitride film 305c by the manufacturing method according to the first embodiment of the present invention. Therefore, an FG type cell having excellent charge retention characteristics can be formed. Further, the writing and erasing window of the FG type cell can be improved since the silicon nitride film 305b cannot be easily oxidized when the silicon oxynitride film 305c is deposited.

Next, differently from the above structure, the case where the interelectrode insulating film 305 has a layered structure formed of the silicon oxynitride film 305a, a high permittivity insulating film 305d, and the silicon oxynitride film 305c will be explained. In this case, the high permittivity insulating film 305d loses charge more easily than the silicon nitride film to have a considerably deteriorated charge retention characteristics, which is the problem revealed by the inventors through investigation.

Here, the leak current can be restrained as stated above by depositing the silicon oxynitride film 305a and the silicon oxynitride film 305c by the manufacturing method according to the first embodiment of the present invention. Therefore, the charge retention characteristics of the FG type cell can be considerably improved.

Note that a similar effect can be obtained by using, for example, any one of $Al_2O_3$, $HfO_2$, $ZrO_2$, HfSiO, HfSiON, and HfAlO as the high permittivity insulating film 305d.

In the case where the high permittivity insulating film 305d such as Hf etc. having a catalyst effect is used, an active oxidant is generated when the silicon oxynitride film 305c is deposited. The oxidant oxidizes the surface of the floating gate electrode 303 and generates a bird's beak in the tunnel isolation film 302 as a side effect, which is the problem revealed by the inventors through investigation.

Here, the oxidation of the surface of the floating gate electrode 303 and the bird's beak in the tunnel isolation film 302 can be restrained by depositing the silicon oxynitride film 305a and the silicon oxynitride film 305c by the manufacturing method according to the first embodiment of the present invention, since the supply amount of the oxidant is small. Therefore, the deterioration in writing characteristics and the variation in cell characteristics can be considerably restrained.

In the manufacturing method according to the first embodiment of the present invention, the etching rate of the silicon oxynitride film to be deposited can be considerably restrained, by which the side etch amount of the interelectrode insulating film 305 can be considerably decreased. Therefore, the variation in cell characteristics can be restrained.

Note that the above effect can be obtained if the interelectrode insulating film 305 is a single-layered silicon oxynitride film deposited by the manufacturing method according to the first embodiment.

Fourth Embodiment

Next, a fourth embodiment of the present invention will be explained.

The fourth embodiment is an example in which the silicon oxynitride film deposited by the manufacturing method according to the first embodiment is used as the side wall insulating film 307 in the above FG type cell (FIG. 7A and FIG. 7B).

In this case, the generation of the bird's beak in the tunnel isolation film 302 and the interelectrode insulating film 305 can be considerably restrained since the supply amount of the oxidant is small when the side wall insulating film 307 is deposited. Therefore, the variation in cell characteristics can be considerably restrained. In particular, a great restraint effect of the bird's beak can be obtained by partially introducing a high permittivity insulating film containing a catalytic metal to the interelectrode insulating film 305.

Note that the above silicon oxynitride film may be used as the side wall insulating film of the MONOS type cell.

Fifth Embodiment

Next, a fifth embodiment of the present invention will be explained referring to FIGS. 8A to 13.

The fifth embodiment is an example in which the silicon oxynitride film deposited by the manufacturing method according to the first embodiment of the present invention is used as the gate insulating film of a MOS transistor.

Each of FIGS. 8A to 12B is a sectional view explaining a method for manufacturing the MOS transistor according to the fifth embodiment of the present invention.

First, as shown in FIG. 8A, a silicon oxide film is embedded in a predetermined region of a silicon substrate 501 to form an element isolation region 502 having an STI (shallow trench isolation) structure and a sacrifice oxide film 503.

Next, as shown in FIG. 8B, a P (phosphorus) 505 is ion-implanted into the silicon substrate 501 using a resist 504 as a mask. The P 505 is implanted a plurality of times to form a diffusion layer and to adjust the threshold voltage of the MOS transistor. There is a case where B (boron), In (indium), etc. is implanted to fine adjust the threshold voltage.

Next, the P 505 finishes being implanted and the resist 504 is removed.

Figure 9A:
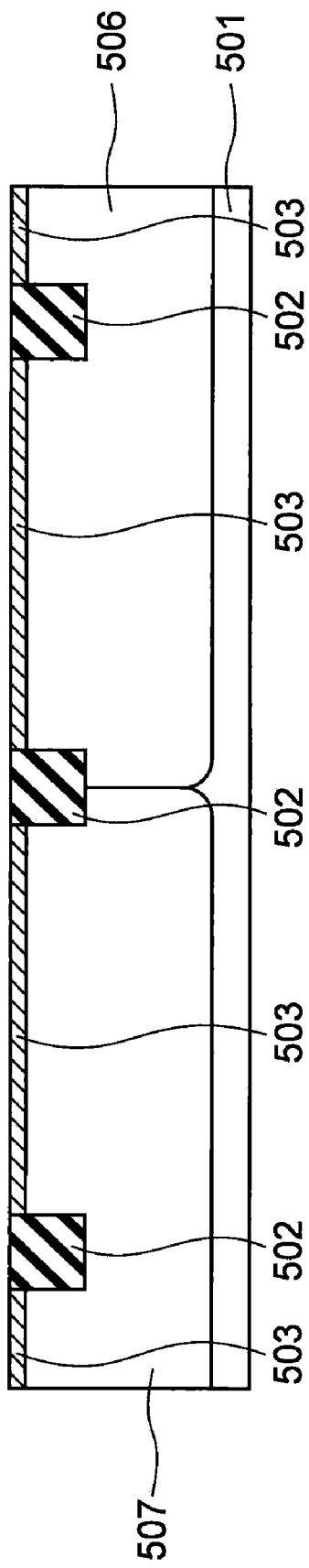

Next, by the method similar to the above method, the B is implanted into the region opposite to the region into which the P 505 is implanted using the resist as a mask, and the resist is removed to perform a thermal diffusion (not shown). In this case, there is a case where As (arsenic), P, etc. is implanted to fine adjust the threshold voltage. By these methods, an N type diffusion layer 506 and a P type diffusion layer 507 are formed as shown in FIG. 9A.

After that, the sacrifice oxide film 503 is removed by using an aqueous solution of $NH_4F$.

Figure 9B:
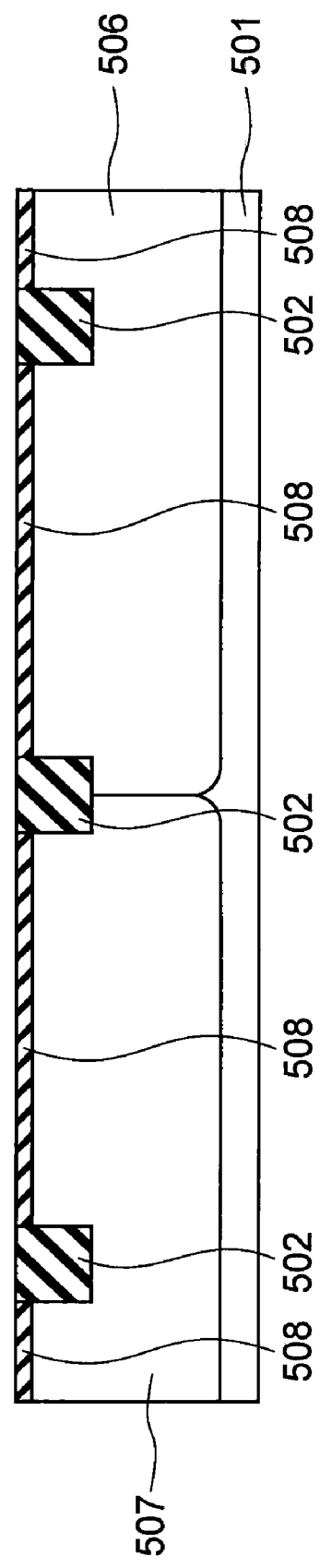

Next, as shown in FIG. 9B, the surface is cleaned by a diluted hydrofluoric acid having a density of 0.5 to 5% and a silicon oxynitride film (gate insulating film) 508 is immediately deposited by the manufacturing method according to the first embodiment of the present invention.

As stated above, in the first embodiment, the silicon oxynitride film 508 having a high quality can be deposited at a lower temperature than the deposition temperature in the CVD method, which is effective, for example, in the case where the process requiring a high temperature cannot be used because of Ge (germanium), etc. contained in the substrate.

Note that nitrogen may be introduced to the silicon oxynitride film 508 deposited by the manufacturing method according to the first embodiment by further using a plasma nitridation method or a thermal nitridation method. By introducing nitrogen to the silicon oxynitride film 508 afterward, the penetration resistance of B can be increased.

Next, as shown in FIG. 10A, a polycrystalline silicon film 510 is deposited on the entire surface.

Next, as shown in FIG. 10B, a B 512 is ion-implanted into a PMOS transistor region using a resist 511 as a mask.

After that, as shown in FIG. 11A, the resist 511 is removed and a P 514 is ion-implanted into the NMOS transistor region using a resist 513 as a mask.

Next, a silicon nitride film or a silicon oxide film 515 is deposited on the entire surface (not shown). Next, the silicon nitride film or silicon oxide film 515 is processed using a resist (not shown) as a mask. Next, as shown in FIG. 11B, the polycrystalline silicon film 510 is processed using the processed silicon nitride film or silicon oxide film 515 as a hard mask.

Further, as shown in FIG. 12A, the silicon oxynitride film 508 is etched using the silicon nitride film or silicon oxide film 515 as a hard mask so that the silicon oxynitride film 508 remains, as a gate insulating film, only underneath the gate electrode (the polycrystalline silicon film 510). Note that the silicon nitride film or silicon oxide film 515 is removed by etching.

Next, as shown in FIG. 12B, an offset spacer 516 formed of a silicon oxide film or a silicon nitride film is deposited on the entire surface by the CVD method and an RIE (Reactive Ion Etching) method.

Then, B is implanted into the N type diffusion layer by using a resist mask (not shown). After that, P or As is ion-implanted into the P type diffusion layer by similarly using a resist mask (not shown). Further, a heat treatment is performed, by which a P type source/drain diffusion layer 517 and an N type source/drain diffusion layer 518 are formed as shown in FIG. 12B.

Next, B is implanted into the N type diffusion layer by using a resist mask (not shown). After that, P or As is ion-implanted into the P type diffusion layer by similarly using a resist mask (not shown). Further, the heat treatment is performed, by which a P type extension diffusion layer 519 and an N type extension diffusion layer 520 are formed as shown in FIG. 12B.

Note that although a halo implantation is generally performed to restrain a short channel effect, the drawings and explanation thereof is omitted.

Then, a side wall spacer is deposited by the CVD method and the RIE method. The fifth embodiment shows an example in which a two-layered side wall spacer formed of a silicon oxide film 521 and a silicon nitride film 522 is deposited as shown in FIG. 12B.

Note that a three-layered side wall spacer using the silicon oxide film, the silicon nitride film, and the silicon oxide film may be deposited. A single-layered side wall spacer using only the silicon nitride film may be deposited. The structure of the side wall spacer to be deposited is designed in accordance with the device to which the side wall spacer is applied.

Then, as in the method for manufacturing a conventional MOS transistor, a salicide is formed, an interlayer insulating film is formed, a contact hole is opened and embedded, and wiring etc. is formed to manufacture a semiconductor integrated circuit (semiconductor device) including the MOS transistor.

FIG. 13 is a diagram showing the characteristics of the stress resistance of the gate insulating film of the MOS transistor according to the fifth embodiment.

FIG. 13 shows the measured result of the gate insulating film (silicon oxynitride film) deposited by the manufacturing method according to the fifth embodiment and the measured result of the gate insulating film (silicon oxide film) deposited by a conventional method (the ALD method, for example) as a comparative example.

The horizontal axis in FIG. 13 represents the total charge amount Qbd ($C/cm^2$) obtained by integrating the amount of the leak current flowing until the gate insulating film causes a dielectric breakdown. The vertical axis represents the Weibull value showing the accumulated fraction defective.

As shown in FIG. 13, the gate insulating film in the comparative example, whose TDDB (Time Dependent Dielectric Breakdown) lifetime is short and has a large variation, cannot be used as the gate insulating film of the MOS transistor. On the other hand, the gate insulating film deposited by the manufacturing method according to the fifth embodiment, whose TDDB lifetime is long and has a small variation, can be used as the gate insulating film of the MOS transistor.

As stated above, in the fifth embodiment, it is possible to manufacture a MOS transistor including the silicon oxynitride film which has a sufficiently low leak current, a high electrical stress resistance, and a high etching resistance and is deposited, as a gate insulating film, at a lower temperature than the deposition temperature in the CVD method, and a semiconductor integrated circuit including the MOS transistor.

Although the embodiments of the present invention were explained in detail hereinbefore, a specific structure is not limited to the above embodiments. Other variations may be made within the scope which does not depart from the subject matter of the present invention.

For example, although the above embodiments explained that the silicon oxynitride film containing nitrogen is deposited, a silicon oxide film containing no nitrogen may be deposited by using a silicon source containing no nitrogen.

The silicon oxynitride film according to one embodiment of the present invention may be used in any one of or combination of the tunnel insulating film, interelectrode insulating film, block insulating film, and side wall insulating film of the nonvolatile semiconductor memory device as stated above. The silicon oxynitride film according to one embodiment of the present invention may be used as a part or the entire part of each film.

The silicon oxynitride film according to one embodiment of the present invention may be used in a nonvolatile semiconductor memory device having a different structure from the cell structure as stated above.

Further, the silicon oxynitride film according to one embodiment of the present invention may be used in a MOS transistor, a MOS capacitor, etc. having a different structure from the structure as stated above.

The invention claimed is:

1. A method for manufacturing a semiconductor device comprising:
   alternately supplying a silicon source and an oxidant to deposit a silicon oxide film on a surface of a semiconductor substrate,
   wherein the silicon source is supplied under a silicon source supply condition where an adsorption amount of molecules of the silicon source on the semiconductor substrate is increased without causing an adsorption saturation of the molecules of the silicon source on the semiconductor substrate,
   wherein the oxidant is supplied under an oxidant supply condition where impurities remain in the molecules of the silicon source adsorbed on the semiconductor substrate, and
   wherein the oxidant is supplied under the oxidant supply condition where a supply of the oxidant is stopped at a point in time where the impurities still remain.

2. The method for manufacturing a semiconductor device according to claim 1, wherein a silicon oxynitride film containing nitrogen is deposited as the silicon oxide film by using a nitrogen-containing silicon source as the silicon source.

3. The method for manufacturing a semiconductor device according to claim 2, wherein the silicon oxynitride film contains 0.1 to 5.0 at.% of nitrogen.

4. The method for manufacturing a semiconductor device according to claim 2, wherein the nitrogen-containing silicon source is an aminosilane type silicon source.

5. The method for manufacturing a semiconductor device according to claim 1, wherein the silicon source is supplied under the silicon source supply condition where a temperature of the semiconductor substrate is higher than a temperature of another semiconductor substrate in an ALD method.

6. The method for manufacturing a semiconductor device according to claim 1, wherein the silicon source is supplied under the silicon source supply condition where a temperature of the semiconductor substrate is 300° C. to 600° C.

7. The method for manufacturing a semiconductor device according to claim 1, wherein the silicon source is supplied under the silicon source supply condition where a supply amount of the silicon source is greater than a supply amount of another silicon source in an ALD method.

8. The method for manufacturing a semiconductor device according to claim 1, wherein the silicon source is supplied under the silicon source supply condition where a supply pressure of the silicon source is higher than a supply pressure of another silicon source in an ALD method.

9. The method for manufacturing a semiconductor device according to claim 1, wherein the silicon source is supplied under the silicon source supply condition where a supply time of the silicon source is longer than a supply time of another silicon source in an ALD method.

10. The method for manufacturing a semiconductor device according to claim 1, wherein a supply time of the oxidant is set shorter than a supply time of the silicon source in each cycle of an alternating supply of the silicon source and the oxidant.

11. The method for manufacturing a semiconductor device according to claim 1, wherein an oxygen/silicon composition ratio of the silicon oxide film is 2.00 to 2.05.

12. The method for manufacturing a semiconductor device according to claim 1, wherein a supply of the silicon source and a supply of the oxidant are repeated.

13. A method for manufacturing a semiconductor device comprising:
   alternately supplying a silicon source and an oxidant to deposit a silicon oxide film on a surface of a semiconductor substrate,
   wherein the silicon source is supplied under a silicon source supply condition where a supply time of the oxidant is set shorter than a supply time of the silicon source in each cycle of an alternating supply of the silicon source and the oxidant, and
   wherein the oxidant is supplied under an oxidant supply condition where a supply of the oxidant is stopped at a point in time where impurities still remain.

* * * * *